United States Patent [19]

Chen et al.

[11] Patent Number: 5,198,725

[45] Date of Patent: Mar. 30, 1993

[54] METHOD OF PRODUCING FLAT ECR LAYER IN MICROWAVE PLASMA DEVICE AND APPARATUS THEREFOR

[75] Inventors: Ching-Hwa Chen, Milpitas; Gerald Yin, Cupertino, both of Calif.; Takashi Inoue, Tokyo, Japan

[73] Assignee: Lam Research Corporation, Fremont, Calif.

[21] Appl. No.: 729,211

[22] Filed: Jul. 12, 1991

[51] Int. Cl.[5] .............................................. H05H 1/18
[52] U.S. Cl. ......................... 315/111.41; 315/111.21; 313/231.31; 204/298.16; 204/298.37; 204/298.38
[58] Field of Search ...................... 315/111.21, 111.41, 315/111.71; 313/231.31; 204/298.38, 298.37, 298.16

[56] References Cited

U.S. PATENT DOCUMENTS

| | | | |
|---|---|---|---|
| 4,292,568 | 9/1981 | Wells et al. | 315/111.41 X |
| 4,401,054 | 8/1983 | Matsuo et al. | 118/723 |
| 4,438,368 | 3/1984 | Abe et al. | 315/39 |
| 4,806,829 | 2/1989 | Nakao | 315/111.81 |
| 4,810,935 | 3/1989 | Boswell | 315/111.21 X |
| 4,859,908 | 8/1989 | Yoshida et al. | 315/111.81 |
| 4,911,814 | 3/1990 | Matsuoka et al. | 315/111.41 |
| 4,919,783 | 4/1990 | Asamaki et al. | 204/298.16 |
| 4,947,085 | 8/1990 | Nakanishi et al. | 315/111.41 |
| 4,973,883 | 11/1990 | Hirose et al. | 315/111.41 |
| 4,990,229 | 2/1991 | Campbell et al. | 204/298.06 |
| 5,032,202 | 7/1991 | Tsai et al. | 315/111.41 X |

Primary Examiner—Eugene R. LaRoche
Assistant Examiner—Do Hyun Yoo

Attorney, Agent, or Firm—Burns, Doane, Swecker & Mathis

[57] ABSTRACT

A microwave plasma generating device including a plasma chamber for generating plasma, a reaction chamber having a specimen stage on which a specimen is treated with the plasma, a gas supply for supplying gas to the plasma generating chamber, a microwave generator for generating a microwave electric field in the plasma and reaction chambers and a plurality of axially spaced apart and concentric electromagnet coils for generating a magnetic field in the plasma and reaction chambers. The microwave electric field and the magnetic field have perpendicularly crossing components and the magnetic field has a strength which decreases in the axial direction from the plasma chamber towards the reaction chamber with constant strength magnetic flux density lines lying in planes which are substantially parallel to each other and perpendicular to the axial direction. The magnetic field produces a flat ECR condition wherein the ECR layer extends perpendicularly to the axial direction over at least 50% of the width of the plasma chamber. In a method of using this device, upper and lower electromagnets produce magnetic fields such that the magnetic field produced by the lower electromagnet is weaker than that produced by the first electromagnet. For instance, the upper electromagnet can be supplied a higher amount of current than the lower electromagnet. Alternatively, the upper and lower electromagnets can be supplied the same amount of current but the lower electromagnet can be larger in diameter than the first electromagnet. This allows the ECR layer to be made thicker in the axial direction than an ECR layer produced by a conventional plasma generating device.

21 Claims, 8 Drawing Sheets (PRIOR ART)
FIG. 1

METHOD OF PRODUCING FLAT ECR LAYER IN MICROWAVE PLASMA DEVICE AND APPARATUS THEREFOR

BACKGROUND OF INVENTION

1. Field of Invention

The present invention relates to the use of a microwave plasma processing device in the etching and film growth processes. More particularly, the invention is used in the process of manufacturing semiconductor devices. The plasma is generated by microwaves with electron cyclotron resonance ("ECR") excitation.

2. Description of Related Art

Several advantages are realized by devices in which plasma is generated by electron cyclotron resonance excitation. For example, a highly active plasma can be generated at low gas pressures, ion energies can be selected from a wide range of magnitudes, large ionic currents can be realized, and excellent directionality and homogeneity of ionic currents can be achieved.

Figure 1:
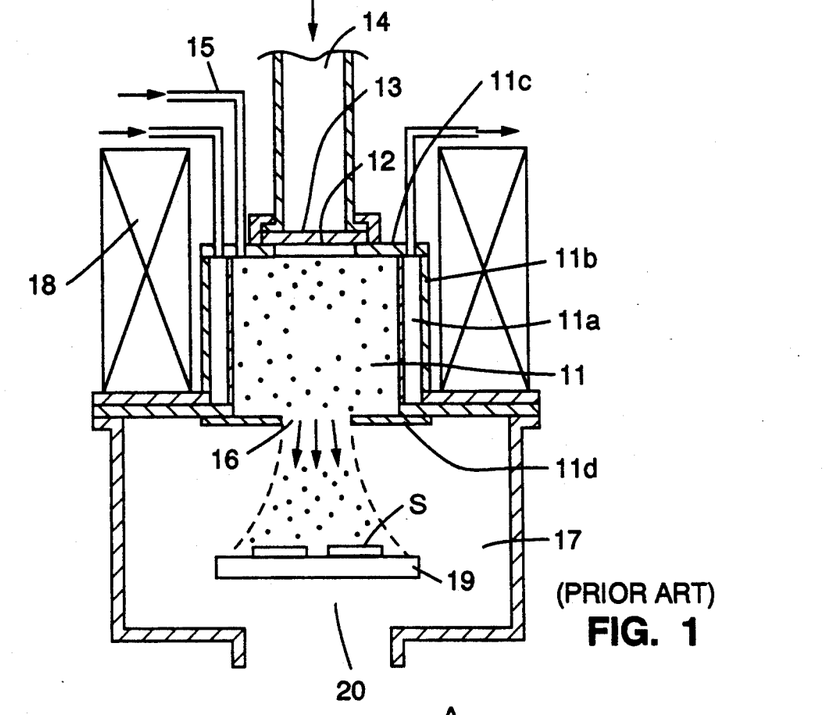
FIG. 1 shows a cross section of a conventional plasma generating device.
Figure 2:
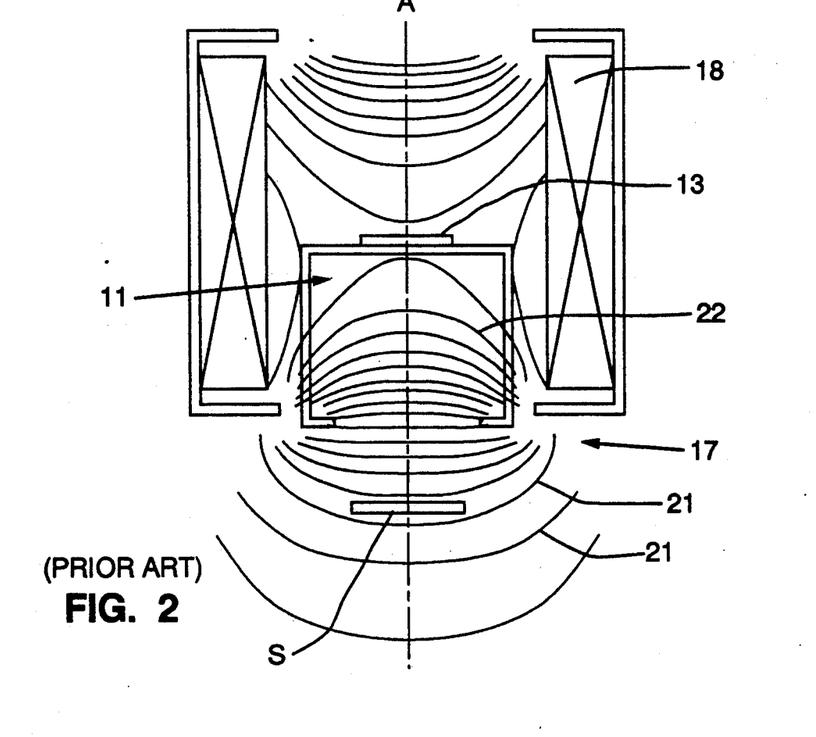
FIG. 2 shows the magnetic field strength lines within the FIG. 1 conventional apparatus.

FIG. 1 is a cross section of a conventional microwave plasma apparatus which is used for etching and which operates on the principle of electron cyclotron resonance excitation initiated by microwaves. FIG. 2 shows the constant strength flux density lines exemplary of the magnetic field of the conventional apparatus shown in FIG. 1.

As shown in FIG. 1, plasma generating chamber 11 is comprised of cylindrical outer wall 11b which has coolant circuit 11a, upper wall 11c and lower wall 11d. Microwave feeding hole 12 is located at the center of upper wall 11c. Microwave feeding hole 12 is sealed with microwave feeding window 13 and is connected to a lower end of wave guide 14 at feeding window 13. The upper part of wave guide 14 is connected with a microwave generator (not shown). A generated microwave is introduced through wave guide 14 and feeding window 13 into plasma generating chamber 11. Gas feeding pipe 15 is connected with upper wall 11c. Electro-magnetic exciting coil 18 is coaxially placed around both plasma generating chamber 11 and the lower end of wave guide 14.

At lower wall 11d of plasma generating chamber 11, there is plasma extraction window 16. Located below plasma extraction window 16 is reaction chamber 17 which is connected with plasma generating chamber 11. Sample holder stage 19 for holding wafer S or some other sample, with an electro-static chuck or other conventional means for holding the sample in place, is positioned in reaction chamber 17 facing plasma extraction window 16. Pumping hole 20 at the lower wall of reaction chamber 17, is connected with an evacuation system (not shown).

The following describes the operation of an etching process with the above-mentioned conventional microwave plasma apparatus. First, plasma generating chamber 11 and reaction chamber 17 are evacuated. Following evacuation, gas is fed into plasma generating chamber 11 through gas feeding pipe 15. Electro-magnetic coil 18 creates a magnetic field within the apparatus. After formation of the magnetic field, a microwave is introduced into plasma generating chamber 11 through wave guide 14 and microwave feeding window 13. Plasma is then formed as a result of the resonance excitation initiated in the gas inside plasma generating chamber 11 which acts as a microwave resonant cavity. The plasma generated is transported and brought into contact with sample surface S in reaction chamber 17 by the force of the diverging magnetic field wherein the magnetic flux density of the magnetic field is decreasing in a direction toward reaction chamber 17 thereby ensuring that the surface of the sample S is etched by the plasma.

Constant strength magnetic flux density lines 21 of the apparatus shown in FIG. 1 are convex, as shown in FIG. 2, with respect to microwave feeding window 13 in plasma generating chamber 11 and concave with respect to sample S in reaction chamber 17. At the midpoint of a line drawn from feeding window 13 to sample S, constant strength magnetic flux density lines 21 approach complete flatness. The region along axis A where constant strength magnetic flux density lines 21 are flat is small and the gradient of the magnetic field is steep. With the resulting magnetic field configuration, the ratio of the microwave power absorption efficiency to the amount of plasma is low. Absorption is large at the center of the device causing the plasma density distribution and the stability to be poor.

The conventional apparatus shown in FIGS. 1 and 2 provides an 875 G region which is thin in axial direction A since the device generates a non-flat ECR condition. Constant strength magnetic flux density line 22 represents the 875 G region. In this case, a very small area of the ECR layer is flat with respect to a plane perpendicular to axial direction A. As mentioned above, this provides high microwave absorption only at the center of plasma generating chamber 11 with the result that plasma density distribution and stability is poor. Hereafter, such an arrangement is referred to as the "non-flat ECR condition."

U.S. Pat. No. 4,911,814 ("the '814 patent") discloses a thin film forming apparatus and ion source utilizing sputtering with microwave plasma. In particular, the '814 patent discloses a sputtering type ion source utilizing ECR plasma. Several embodiments of the apparatus disclosed in the '814 patent include two vertically spaced-apart electromagnets above and below an entry hole in a side of a plasma chamber through which microwave energy is introduced. The electromagnets are arranged such that a magnetic field sufficient to cause ECR is produced and the magnetic flux passes between two targets in the plasma generating chamber. The currents passing through the electromagnets can be 20A each or the current passing through the electromagnet closest to the reaction chamber can be 20A whereas the current passing through the other electromagnet can be 10A. The '814 patent does not disclose the shape of the ECR layer nor is there any suggestion of supplying a lower amount of current to the electromagnet located closest to the reaction chamber.

Other ECR type plasma treating apparatuses are disclosed in U.S. Pat. Nos. 4,401,054; 4,438,368; 4,806,829; 4,859,908; 4,947,085; 4,973,883; and 4,990,229.

There is a need in the art for a microwave plasma generating device which provides a strong, uniform and stable plasma. Applicants have developed an apparatus which produces an improved magnetic field distribution resulting in enhanced microwave power efficiency in the plasma and improved uniformity with respect to plasma density, absorption distribution uniformity.

SUMMARY OF THE INVENTION

The invention provides a microwave plasma generating device which includes a plasma chamber for generating plasma, a reaction chamber having a specimen stage on which a specimen is treated with the plasma, gas supply means for supplying gas to the plasma generating chamber, means for generating a microwave electric field in the plasma and reaction chambers, and means for generating a magnetic field in the plasma and reaction chambers. The microwave electric field and magnetic field have perpendicularly crossing components of the magnetic field and electric field. The magnetic field also has a strength which decreases in an axial direction from the plasma chamber towards the reaction chamber and has constant strength magnetic flux density lines lying in planes which are substantially parallel to each other and perpendicular to the axial direction, the magnetic field producing a flat ECR condition. The microwave generating means preferably supplies microwave energy at 2.45 GHz and the magnetic field has an 875 G region which is thick in the axial direction compared to the 875 G region generated by a non-flat ECR condition.

According to one aspect of the invention, the magnetic field generating means can comprise a plurality of axially spaced apart electromagnets, each of the electromagnets having a substantially equal number of coil turns, the electromagnets located closer to a center of the device having a larger diameter than the electromagnets located further from the center of the device. The magnetic field generating means can include more than three electromagnets, the diameters of the electromagnets becoming progressively smaller towards opposite axial ends of the device.

According to another aspect of the invention, the magnetic field generating means can include a first electromagnet around an axial end of the plasma chamber located furthest from the reaction chamber, a second electromagnet around the plasma chamber and located between the first electromagnet and the specimen stage, and a third electromagnet located such that the specimen stage is between the third electromagnet and the plasma chamber. All of the electromagnets can be located outside of the plasma chamber and the reaction chamber. However, one or more electromagnets could be provided within the reaction chamber. Each of the electromagnets can be supplied with an adjustable amount of current independent of the other electromagnets. However, some or all of the electromagnets can be connected in series to a common direct current source.

According to one feature of the invention, the magnetic field generating means can include first and second electromagnets having the same diameter, the first and second electromagnets having coils of identical gage, the first and second electromagnets being spaced apart along the axial direction, the first electromagnet having a higher number of coil turns than the second electromagnet and the first electromagnet being further from the specimen stage than the second electromagnet.

According to another feature of the invention, the magnetic field generating means can include first and second electromagnets having the same diameter, the first and second electromagnets having coils of identical gage wire, the first and second electromagnets being spaced apart along the axial direction, the first and second electromagnets having the same number of coil turns, the first electromagnet being further from the specimen stage than the second electromagnet, the magnetic field generating means including a first direct current power supply electrically connected to the first electromagnet and a second direct current power supply electrically connected to the second electromagnet, and the first power supply supplying an amount of electrical current to the first electromagnet which is greater than an amount of electrical current supplied by the second power supply to the second electromagnet.

According to a still further feature of the invention, the magnetic field generating means can include first and second electromagnets having coils of identical gage wire, the first and second electromagnets being spaced apart in the axial direction with the first electromagnet being further from the specimen stage than the second electromagnet, the first and second electromagnets having the same number of coil turns, the magnetic field generating means including direct current power supply means electrically connected to the first and second electromagnets, the power supply means supplying the first and second electromagnets with the same amount of electrical current, and the second electromagnet having a diameter which is greater than a diameter of the first electromagnet.

The invention also provides a method of forming a flat ECR layer in a microwave plasma generating device. The device includes a plasma generating chamber into which gas is introduced for generating plasma therein, a microwave introducing system for supplying microwave energy into the plasma generating chamber, a specimen chamber communicated with the plasma generating chamber, a substrate holder in the specimen chamber for supporting a specimen to be treated by plasma generated in the plasma generating chamber, and at least first and second electromagnets. The first electromagnet is located further from the substrate holder than the second electromagnet, the first and second electromagnets being spaced apart in an axial direction. The method includes the steps of introducing gas into the plasma generating chamber, introducing microwave energy into the plasma generating chamber and generating plasma in the plasma generating chamber, and supplying a first amount of direct current to the first electromagnet and supplying a second amount of direct current to the second electromagnet so as to form a flat ECR layer in the plasma. The microwave energy can be introduced at 2.45 GHz so as to provide the ECR resonance conditions with the magnetic field which has an 875 G region which is thick in the axial direction compared to the 875 G region generated by a non-flat ECR condition.

According to one aspect of the method, the first and second electromagnets can be supplied with different amounts of current. Alternatively, the first and second electromagnets can be supplied with the same amounts of current. For instance, the first and second electromagnets can have the same diameter, and have coils of identical gage wire, the first electromagnet having a higher number of coil turns than the second electromagnet, in which case the same amount of current is supplied to the first and second electromagnets. In this case, however, the amount of current supplied to the first electromagnet can be greater or less than the amount of current supplied to the second electromagnet provided the number of coil turns of the first electromagnet is sufficient to create the flat ECR condition. Alternatively, the first and second electromagnetics can have the same diameter and have coils of identical gage wire, with the first and second electromagnetics having the same number of coil turns, in which case the amount of electrical current supplied to the first electromagnet is greater than the amount of electrical current supplied to the second electromagnet. Another possibility is where the first and second electromagnets have coils of identical gage wire and have the same number of coil turns, with the second electromagnet having a diameter which is greater than a diameter of the first electromagnet, in which case the first and second electromagnets are supplied with the same amount of electrical current. In this case, however, the amount of current supplied to the first electromagnet can be greater or less than the amount of current supplied to the second electromagnet provided the diameter of the second electromagnet is selected so as to create the flat ECR condition. In each case, a flat ECR condition can be produced with the flat ECR layer extending over at least 50%, preferably at least 75% and even over 85% of the width of the plasma chamber.

DESCRIPTION OF THE PREFERRED EMBODIMENTS

Applicants have discovered several ways to overcome deficiencies of prior art microwave plasma devices by providing a method and apparatus which produces a flat ECR condition. In particular, the magnetic field distribution can be changed by adjusting the ampere-turn number distribution of the solenoid coils of the electromagnets, employing a number of solenoid coils of different diameters and/or adjusting currents of the electromagnets.

The above techniques can be used to make an expanded region where the constant strength magnetic flux density lines are flat and parallel to each other. As a result, the field strength of the constructed magnetic field distribution can be changed without altering the distribution pattern by changing the currents of every coil linearly, i.e. in the same proportion. A magnetic field with a strength distribution generated according to the aforementioned methods has parallel constant strength magnetic flux density lines and small gradients of the magnetic field in an axial direction (the direction in which the plasma moves from the plasma generating chamber to the reaction chamber).

In accordance with the invention, an electron cyclotron resonance (ECR) plasma generating device is provided in which a microwave of 2.45 GHz and a magnetic field strength of 875 G can generate plasma perpendicular to the microwave electric field such that the microwave power is uniformly absorbed and a uniform density plasma can be generated. In particular, a flat ECR condition is produced wherein the ECR layer extends perpendicular to the axial direction over at least 50%, preferably 75% and more preferably over 85% or more of the plasma generating chamber. Also, the ECR plasma layer (located along the 875 G constant strength magnetic flux density line) can be generated at any position between the inside of the plasma chamber and the sample while maintaining the ECR generating condition constant. As a result, the ion current density and the generated plasma density, each of which are dependent on the plasma generating distance, can be optimized around the sample. Optimization results in a uniform and stable plasma generated across the sample surface.

Figure 3:
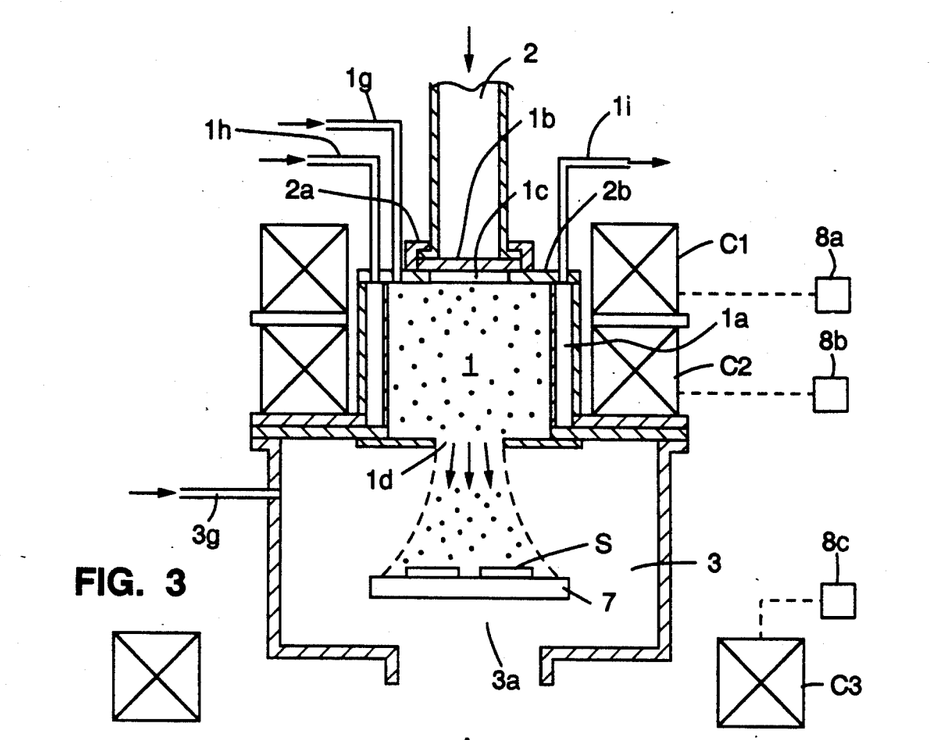
FIG. 3 shows a cross section of a plasma generating device according to the present invention.

FIG. 3 shows a cross section of a microwave plasma processing device according to the present invention. The device includes plasma generating chamber 1, wave guide 2, reaction chamber 3 with sample stage 7 for holding sample S to be etched or provided with a film and three electromagnets C1, C2 and C3. C1 is located around the upper part of reaction chamber 1. C2 surrounds plasma chamber 1. C3 is located below sample stage 7. Each coil is covered with iron to create a magnetic energy saving magnetic circuit.

Plasma generating chamber 1 has double peripheral walls, which form hollow chamber 1a furnished with cooling water and is configured in such a manner that plasma generating chamber 1 can act as a cavity resonator for microwaves. Microwave feeding hole 1c is located in the center of the upper wall, and plasma extraction outlet 1d is located at the center of the lower wall opposite microwave feeding hole 1c. Microwave window 1b seals the lower end of wave guide 2 to microwave feeding hole 1c while sample stage 7 in reaction chamber 3 is axially aligned so as to face plasma extraction outlet 1d.

The upper end of wave guide 2 is connected to a microwave generator (not shown) which generates microwaves to be introduced into plasma generating chamber 1. Electromagnets C1, C2 and C3 are connected to respective direct current sources 8a, 8b and 8c and form a magnetic field when a direct current is passed through the coils of electromagnets C1, C2 and C3. Plasma is generated as a result of introducing gas through line 1g and introducing microwaves through window 1b into plasma generating chamber 1 and energizing electromagnets C1, C2 and C3. The apparatus is maintained at subatmospheric pressure by evacuation port 3a located beneath sample holder 7 or at another location such as one side of reaction chamber 3.

Figure 4:
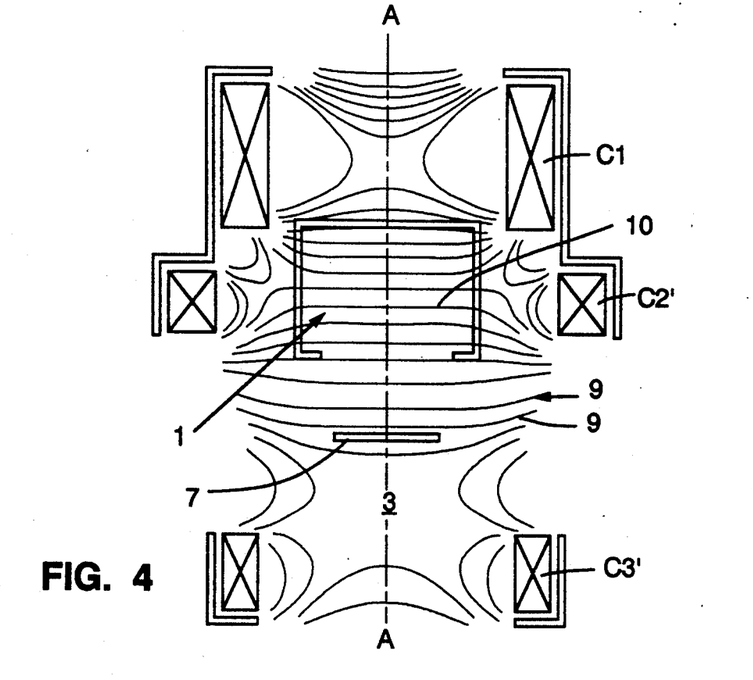
FIG. 4 shows magnetic field strength lines within the FIG. 3 apparatus.

FIG. 4 is representative of the magnetic field distribution which can be produced in the apparatus of FIG. 3. In FIG. 4, however, electromagnet C2' has a greater diameter than electromagnet C2 in FIG. 3 and electromagnet C3' is located inside reaction chamber 3 whereas electromagnet C3 in FIG. 3 is located outside of reaction chamber 3.

The magnetic field strength distribution within the apparatus can be adjusted by changing the ampere-turn number distribution of the coils of electromagnets C1, C2 and C3. For example, the ratio of the ampere-turn number from C1 to C2 to C3 can be 30:35:10. Lines 9 shown in FIG. 4 represent the constant strength magnetic flux density lines ($|B|$=constant). The microwave electric field is assumed to be horizontal. The magnetic field component perpendicular to the electric field is Bz where Bz is in the Z-direction along axis A.

The magnetic field strength $|B|$ and $|Bz|$ are substantially equal except in the region far from the central axis. In this embodiment, the ion current density obtained is 18 mA/cm$^2$ with a uniformity of ±3% in a 200 mm diameter area at the specimen position with a microwave power of 1 kW and an argon gas pressure of 1 mTorr.

Figure 5:
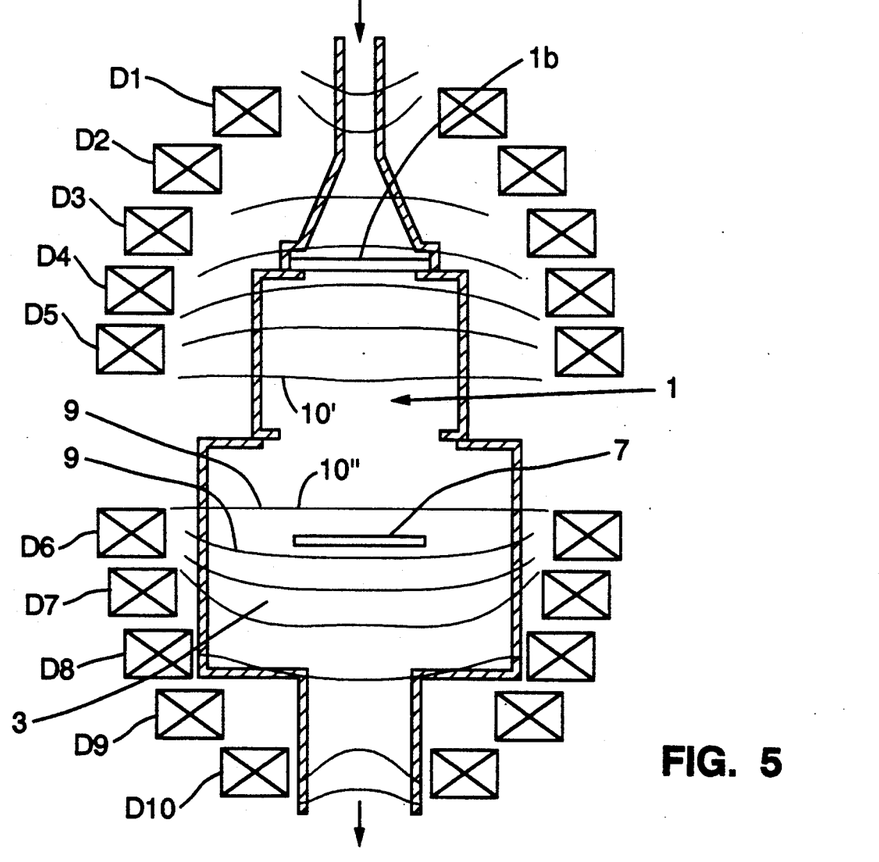
FIG. 5 shows magnetic field strength lines within a modified plasma generating device according to the invention.

FIG. 5 shows the magnetic field arrangement with another preferred embodiment of the present invention. Parts having the same function as parts shown in FIG. 3 are identified with the same numerals. The coils D1 to D10 of this apparatus are in the form of a cocoon shape. Reaction chamber 3 and the plasma chamber 1 are within the cocoon. Magnetic field strength lines 9 are of equimagnetic field strength. With this embodiment, a nearly flat magnetic field strength surface can be created with the same currents and numbers of turns for each coil D1 to D10. The magnetic field strength distribution can be varied by changing the magnitude of coil current applied to coils D1 to D10 without affecting the shape of the magnetic field distribution. For instance, the coils D1 to D10 can be electrically connected in series and the ECR layer can be moved from the position represented by line 10' to the line represented by line 10'' by increasing the amount of current applied to electromagnets D1 to D10.

Figure 6:
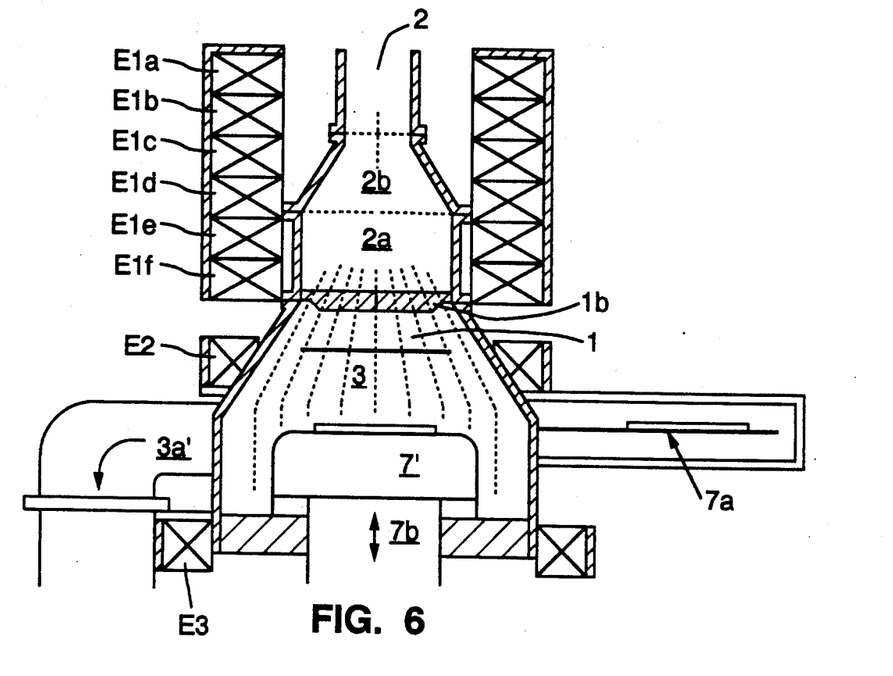
FIG. 6 shows another embodiment of an apparatus in accordance with the invention.

In another embodiment, the energizing coils of the plasma generating device are equal in diameter and arranged in a stack of two or more coils. For instance, the stack could include six coils as shown in FIG. 6. A decreasing current in a direction of movement of plasma generated in the device can be achieved by reducing the number of turns of at least one downstream coil. For instance, the ratio of turns in an upstream coil to a downstream coil can be any amount such as 6:1, 3:2, 2:1.5, 2:1, etc. With the arrangement shown in FIG. 6, the ratio of turns of coils E1a:E1b:E1c:E1d:E1e:E1f can be selected such that one of the downstream electromagnets located closer to reaction chamber 3 has a lower number of coils than an upstream electromagnet further from reaction chamber 3.

Coil E2 can include a stack of sub-coils E2a, E2b and E2c. The diameter of coil E2 can exceed the diameter of coils E1a to E1f. Likewise, coil E3 can include a stack of sub-coils E3a, E3b and E3c having diameters intermediate those of coil E1 and coil E2c.

As shown in FIG. 6, plasma formation chamber 1 is located below coil E1f. In particular, rectangular or circular wave guide 2 is connected to larger circular wave guide 2a by tapered adaptor 2b. Microwave introducing window 1b seals plasma formation chamber 1 from a lower end of larger wave guide 2a. Reaction zone 3 is not separated from plasma formation chamber by a plasma aperture ring but rather, reaction zone 3 is within the same area the plasma is formed. Sample loader 7a is located on one side of plasma formation/reaction chamber 1,3 at a location immediately below coil E2. Side evacuation port 3a' is located on another side of plasma formation/reaction chamber 1,3 at a location below coil E2. Vertically movable cylinder 7b is used to raise and lower substrate holder 7'.

Figure 7A:
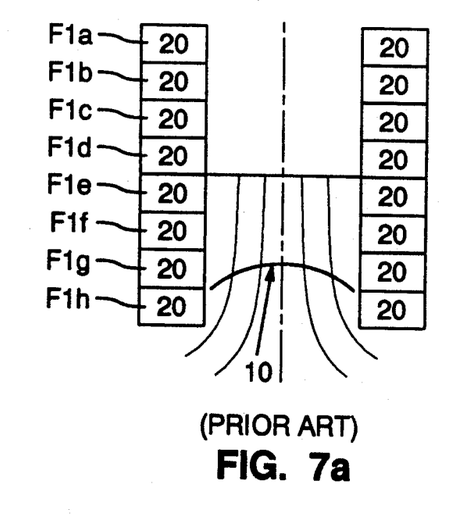
FIG. 7a shows a conventional main coil electromagnet arrangement which produces a non-flat ECR condition.
Figure 7B:
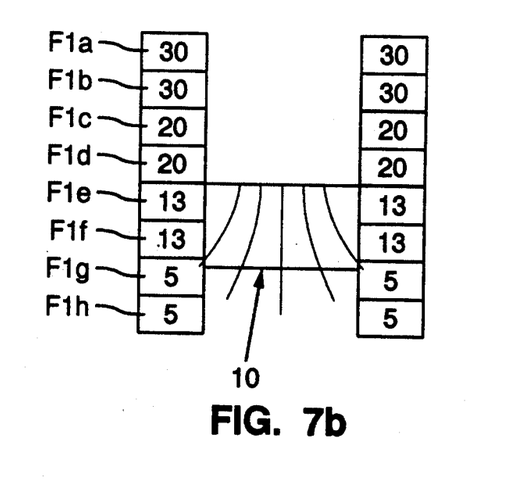
FIG. 7b shows a main coil electromagnet arrangement for producing a flat ECR condition in accordance with the invention.

FIG. 7a shows a conventional main coil arrangement for a plasma generating device wherein the coils are connected in series, each coil has the same number of turns and the same current, e.g., 20A, is passed therethrough. FIG. 7b shows a main coil arrangement in accordance with the invention wherein eight coils having the same number of turns of the same gage wire are connected to separate power supplies such that the coils receive different amounts of current, e.g., 30A, 30A, 20A, 20A, 13A, 13A, 5A, 5A, respectively. Line 10 in FIG. 7a represents the non-flat ECR condition of the prior art apparatus whereas line 10 in FIG. 7b shows the flat ECR condition obtainable with the apparatus of the invention. In this case, main coil F includes subcoils F1a, F1b, F1c, F1d, F1e, F1f, F1g and F1h surrounding the plasma formation chamber.

Figure 8:
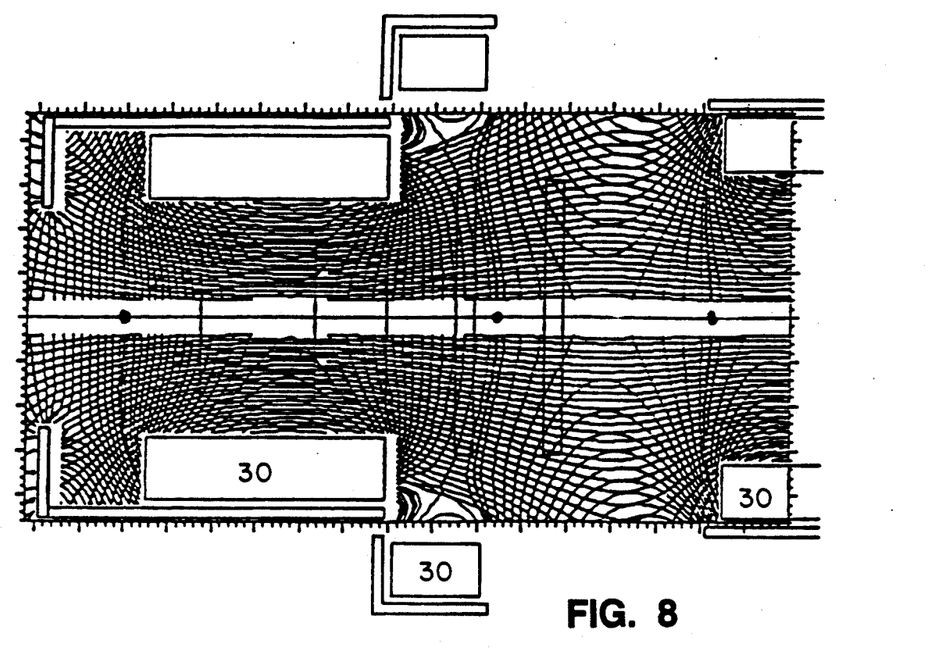
FIGS. 8-14 show simulations of magnetic field amplitude lines in accordance with the invention.
Figure 9:
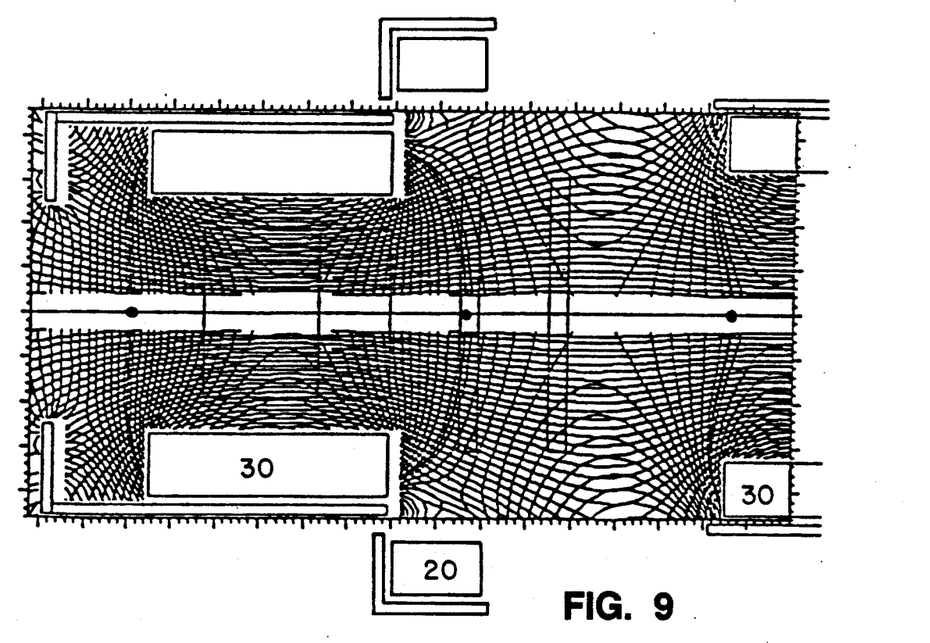

FIGS. 8-14 show simulated magnetic field amplitude lines ($|B|$ lines) for cases where the magnetic field produced by each of the electromagnets is adjusted in accordance with the invention. The simulations apply to the apparatus shown in FIGS. 3, 4, 5, 6 and 7b. For instance, in FIG. 8, the coil or coils in main coil E1, the coil or coils in intermediate coil E2 and the coil or coils in lower coil E3 have the same current and ratio of turns in all coils, i.e., 30A in each electromagnet E1, E2 and E3. In this case, coil E2 has a larger diameter than main coil E1 and the magnetic field produced by coil E2 is effective in producing a flat ECR condition, as shown in FIG. 8. FIG. 9 shows $|B|$ lines for turn ratios or current ratios of E1:E2:E3 of 30:20:30.

Figure 10:
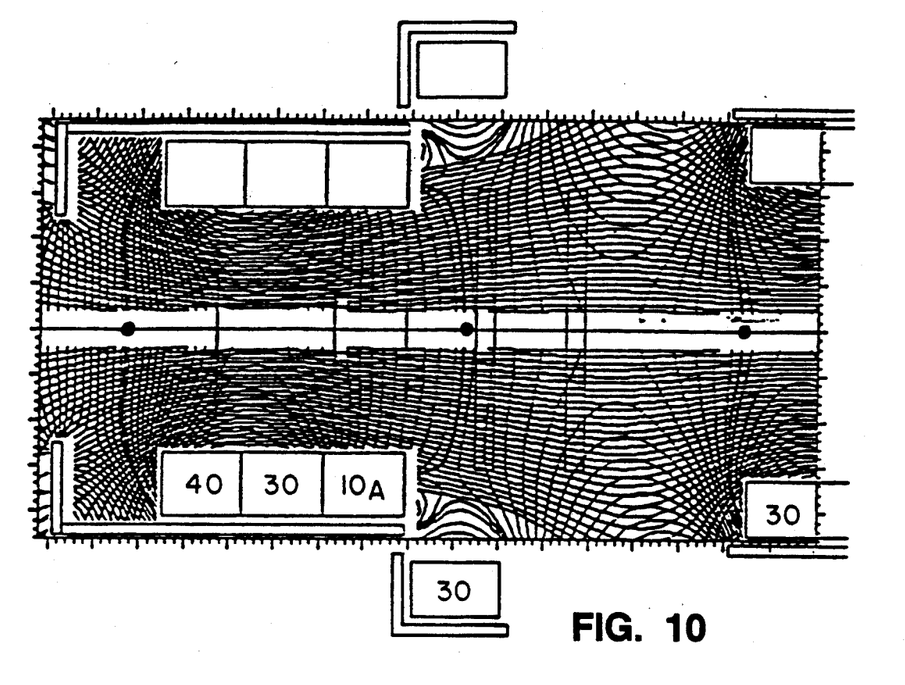
Figure 11:
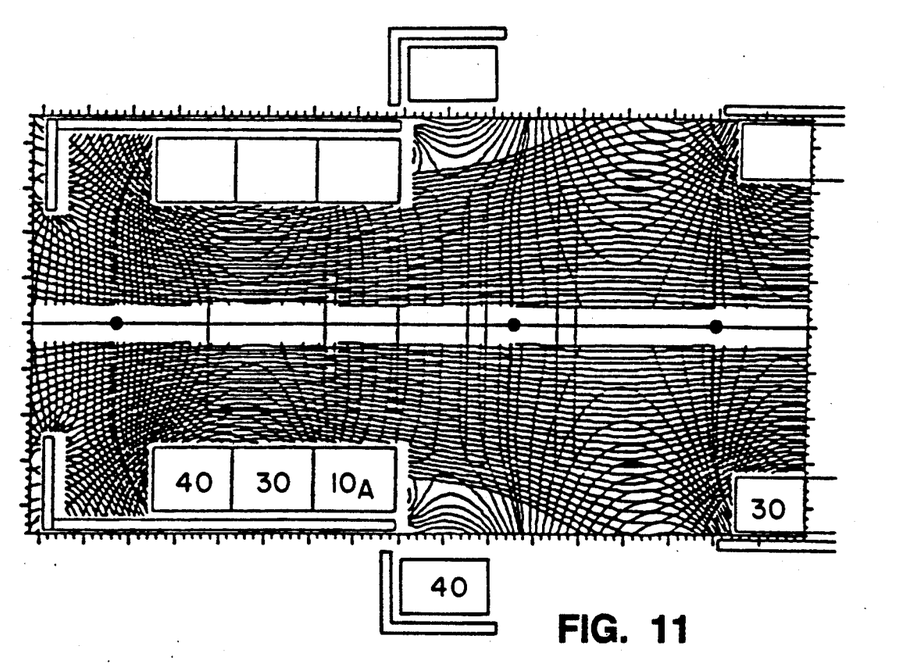
Figure 12:
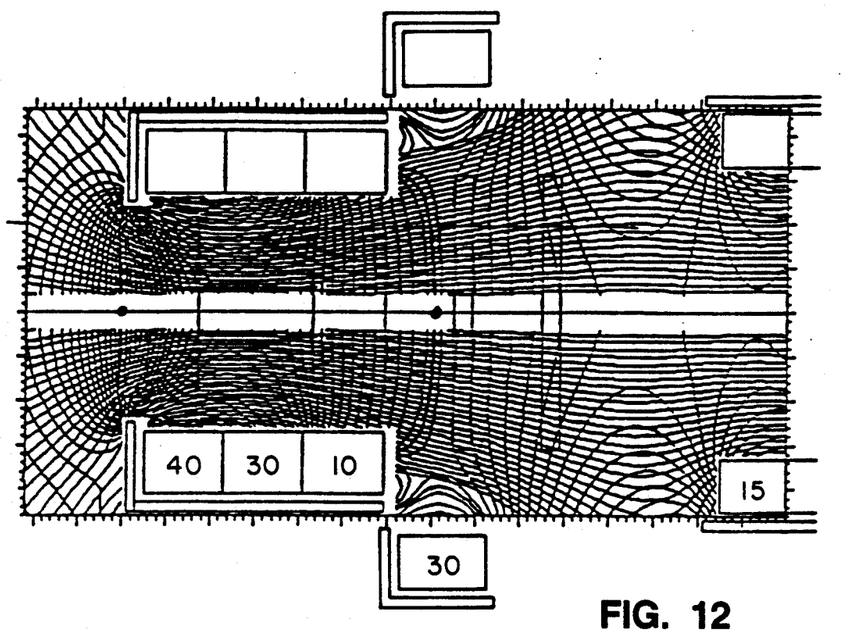
Figure 13:
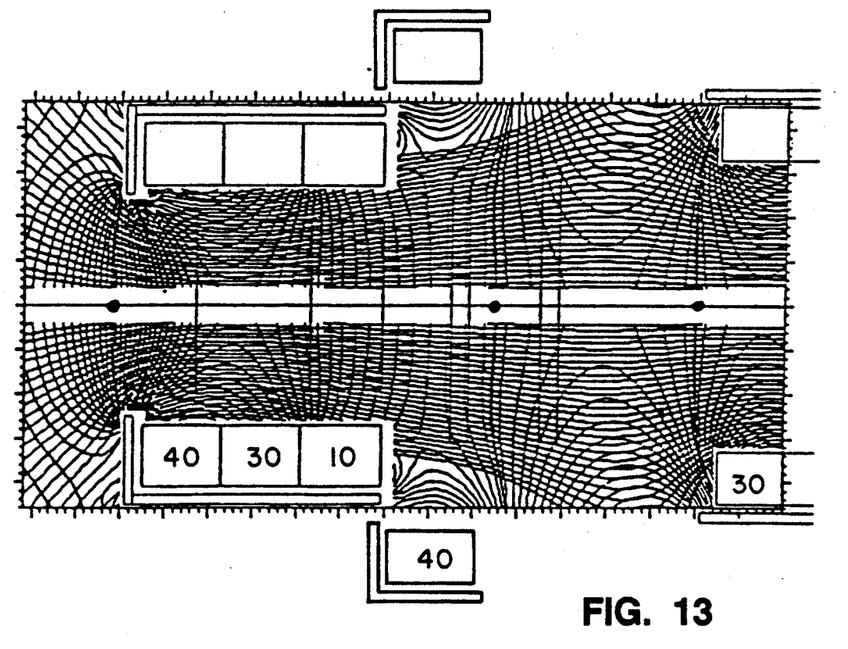

FIGS. 10-13 shows $|B|$ lines for the case where the sub-coils in main coil E1 receive decreasing amounts of current or have decreasing ampere-turn ratios. In FIG. 10, E1a:E1b:E1c:E2:E3 equals 40:30:10:30:30. In FIG. 11, E1a:E1b:E1c:E2:E3 equals 40:30:10:40:30. In FIG. 12, E1a:E1b:E1c:E2:E3 equals 40:30:10:30:15. In FIG. 13, E1a:E1b:E1c:E2:E3 equals 40:30:10:40:30. The arrangement in FIG. 13 differs from that in FIG. 11 with respect to the iron shielding around coil E1.

Figure 14:
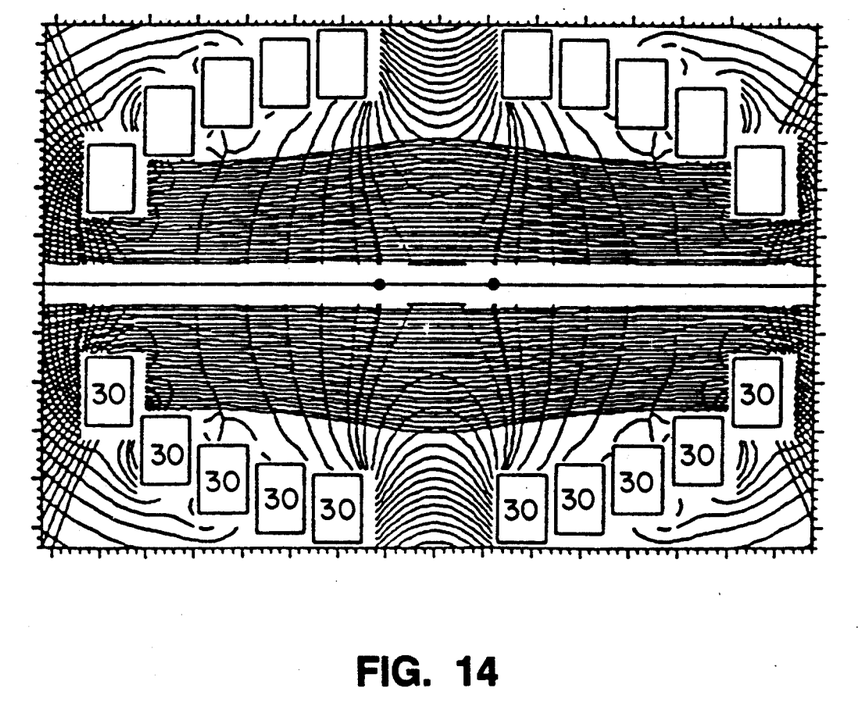

FIG. 14 shows a simulation for the cocoon arrangement of coils D1 to D10 shown in FIG. 5. The diameters of coils D1 to D5 progressively increase gradually to a maximum diameter towards the center of the device whereas coils D6 to D10 decrease gradually to a minimum diameter. The diameters of coils D1 and D10 are the same. Likewise, coils D2 and D9 have the same diameter, coils D3 and D8 have the same diameter, coils D4 and D7 have the same diameter and coils D5 and D6 have the same diameter. In this case, the ampere-turn ratio in each of coils D1 to D10 is the same. For instance, the ampere-turn ratio of D1:D2:D3:D4:D5:D6:D7:D8:D9:D10 is 30:30:30:30:30:30:30:30:30:30.

The following example is for purposes of illustrating various aspects of the invention, it being understood that the same is intended only as illustrative and in nowise limitative.

EXAMPLE

The following summarizes calculations used to examine the feasibility of running the main coils as a cusp mirror or to obtain a flat ECR layer needed to etch the wafer at the ECR layer.

For these calculations, the iron around the main coil was taken to have a relative permeability of 500. This is extremely low for iron. Running test calculations with a nonlinear B-H relation or with a relative permeability of 1000 changed the calculated magnetic field a few percent. All materials except iron were assigned a relative permeability of 1.0. Coils were treated as an area of uniform current density. The cross section of this volume was the same as the cross section of the coil. Total current flow in this area was calculated as the input current multiplied by the number of turns. Coordinates are given as (r,z) pairs. The zero in the coordinate is the end of the coil furthest from the reaction chamber and z increases towards the reaction chamber. The r coordinate is zero on the chamber center-line. All distances are in millimeters. $B_r$ is always zero when r is zero.

Calculations for the cusp mirror were made by dividing the eight subcoils of the main coils into two groups. One group consisted of the six coils furthest from the aperture. The other two coils formed the second group. The current in the first group of coils was set at 30A and the current in the other group was varied. With the bottom coils powered at −40A the value of $B_z$ went to zero at (0,271) and (100,252). At (50,277) $B_r$ is 190 G and at (100,277) $B_r$ is 500 G. When the bottom two coils are powered at −25A, the magnetic field in either direction is just a few gauss at any radius and a distance of about 200 mm from the aperture. For both these cases, a continuous $B_z$=875 G layer forms inside the plasma chamber. This layer is a few cm from the microwave window with the bottom coils powered at −40A and moves forward as this current gets less negative. The results indicate cusp fields can be designed to make magnetic field effects at the wafer insignificant.

Calculations were made to see what types of coil configurations could yield an ECR layer that occurs at a given z value over a wide radius. The calculations were based on placing an ECR inside the current main coils. In general, $B_r$ increases as points get further from the center of the chamber. A flat layer of $B_z$=875 G will have a greater Br component the further it is from the center of the coil, and $B_r$ will increase as radius increases.

For the flat field problem the main magnet coils were split into three groups, the four coils farthest from the reaction chamber (Group A), the next two coils (Group B), and the two coils closest to the aperture (Group C). Field strengths were estimated by calculating a field solution with 20A in one group of coils and no current in the others. The field at a given z value was recorded at three radii, 0, 40.2 and 75. It was then assumed that the fields for the three groups added linearly. Given this assumption the magnetic field can be estimated and optimized at the points sampled. Table 1 gives the B vector as a function of coil group and location. Currents calculated by solving the approximate equations exactly to give $B_z$=875 G at the three radii checked at a given z value can be large. The exact solution for z=252 is 43A in Group A, −37.6A in Group B and 43.4A in Group C. The solution for z=357 is 332A in Group A, −235.4A in Group B and 72.0A in Group C. There are a large number of current combinations within the current power supply limits that will provide a nearly flat ECR at a given z value. Some of these are shown in Table 2. A complete simulation was done with the current set at 29.3A, 15.1A, 5.3A for Groups A, B and C, respectively. At z=252 $B_z$ was 874, 877, 877, 872 at radii of 0, 40.2, 75 and 105. Fields were also checked at z values of 247 and 257. These checks indicated $\delta B_z / \delta_z$ was approximately −4.4 G/mm for radii between 0 and 75 mm. The linear approximation gives $B_z$ strengths of 874 G, 870 G, and 878 G at (0,252), (40.2,252) and (75,252), respectively.

TABLE 1

| Powered | B fields for coil groups powered at 20 A. | | | | | |
|---------|-----|-----|-----|-----|-----|-----|
|         | Group A | | Group B | | Group C | |
| Coils   | $B_r$(G) | $B_z$(G) | $B_r$(G) | $B_z$(G) | $B_r$(G) | $B_z$(G) |
| At z = 252 | | | | | | |
| r = 0    | 0    | 303  | 0    | 409  | 0     | 457 |
| r = 40.2 | 55   | 294  | 39.6 | 416  | −44.5 | 472 |
| r = 75   | 103  | 277  | 77.2 | 445  | −88.6 | 514 |
| At z = 357 | | | | | | |
| r = 0    | 0    | 101  | 0    | 168  | 0    | 326 |
| r = 40.2 | 26.7 | 94.2 | 45.4 | 163  | 73.6 | 341 |
| r = 75   | 49.6 | 81.5 | 89   | 146  | 167  | 344 |

TABLE 2

| Estimated B fields for various current combinations | | | |
|---------|-------------|---------|----------|
|         | Current (A) | z = 252 | $B_r$(G) | $B_z$(G) |
| Group A | 29.9  | r = 0    | 0   | 875  |
| Group B | 13.3  | r = 40.2 | 95  | 871  |
| Group C | 6.3   | r = 75   | 179 | .879 |
| Group A | 29.7  | r = 0    | 0   | 877  |
| Group B | 20.9  | r = 40.2 | 123 | 871  |
| Group C | 0.0   | r = 75   | 234 | 876  |
| Group A | 27.8  | r = 0    | 0   | 875  |
| Group B | 27.8  | r = 40.2 | 143 | 869  |
| Group C | −5.0  | r = 75   | 273 | 875  |
|         | Current (A) | z = 357 | $B_r$(G) | $B_z$(G) |
| Group A | 29.75 | r = 0    | 0   | 869  |
| Group B | 8     | r = 40.2 | 205 | 887  |
| Group C | 40    | r = 75   | 443 | 868  |
| Group A | 21.25 | r = 0    | 0   | 875  |
| Group B | 13.75 | r = 40.2 | 207 | 894  |
| Group C | 40    | r = 75   | 448 | 875  |

The calculations indicate that there are a wide range of current configurations that will yield a near flat ECR layer. The optimum configuration will probably be dependent on reducing $B_r$ while minimizing the currents and cooling capacity needed for the coils.

The possibility of making the coils more compact was examined as well. It was found that powering only the three coils closest to the reaction chamber at 30A will provide a continuous ECR layer and a peak field strength of 1030G. This indicates that a magnet of approximately half the size of the current coils should provide enough field strength for in-situ ECR etch. If the magnet contains several coils (5 to 10) currents could probably be adjusted to provide a flat ECR layer. If the magnet has an axis of symmetry perpendicular to the z-axis and the wafer is centered in the coil, there will be no $B_r$ field on the wafer.

While the invention has been described with reference to the foregoing embodiments, changes and variations may be made thereto which fall with the spirit and scope of the invention as defined in the appended claims.

What is claimed is:

1. A microwave plasma generating device, comprising:

a plasma chamber for generating plasma;

a reaction chamber having a specimen stage on which a specimen is treated with the plasma;

gas supply means for supplying gas to the plasma generating chamber;

means for generating a microwave electric field in the plasma and reaction chambers;

means comprising axially spaced apart and concentric electromagnet coils for generating a magnetic field in the plasma and reaction chambers, the microwave electric field and magnetic field having perpendicularly crossing components of the magnetic field and electric field, respectively, the magnetic field having a strength which decreases in an axial direction from the plasma chamber towards the reaction chamber and having constant strength magnetic flux density lines lying in planes which are substantially parallel to each other and perpendicular to the axial direction, the magnetic field producing a flat ECR condition wherein an ECR layer extends perpendicular to the axial direction over at least 50% of the width of the plasma chamber.

2. The microwave plasma generating device of claim 1, wherein the magnetic field generating means comprises a plurality of axially spaced apart electromagnets having coils concentric with each other, each of the electromagnets having a substantially equal number of coil turns, the electromagnets located closer to a center of the device having a larger diameter than the electromagnets located further from the center of the device.

3. The microwave plasma generating device of claim 1, wherein the magnetic field generating means includes a first electromagnet extending completely around an end of the plasma chamber located furthest from the reaction chamber, a second electromagnet extending completely around the plasma chamber and located between the first electromagnet and the specimen stage, and a third electromagnet located such that the specimen stage is between the third electromagnet and the plasma chamber.

4. The microwave plasma generating device of claim 2, wherein the magnetic field generating means includes more than three electromagnets, the diameters of the electromagnets becoming progressively smaller towards opposite axial ends of the device.

5. The microwave plasma generating device of claim 3, wherein all of the electromagnets are located outside of the plasma chamber and the reaction chamber.

6. The microwave plasma generating device of claim 1, wherein the magnetic field generating means includes a plurality of electromagnets having coils concentric with each other and means for supplying each of the electromagnets with an adjustable amount of current independent of the other electromagnets.

7. The microwave plasma generating device of claim 1, wherein the magnetic field generating means includes first and second electromagnets having the same diameter, the first and second electromagnets having coils concentric with each other and of identical gage wire, the first and second electromagnets being spaced apart along the axial direction, the first electromagnet having a higher number of coil turns than the second electromagnet and the first electromagnet being further from the specimen stage than the second electromagnet.

8. The microwave plasma generating device of claim 1, wherein the magnetic field generating means includes first and second electromagnets having coils concentric with each other having the same diameter, the first and second electromagnets having coils of identical gage wire, the first and second electromagnets being spaced apart along the axial direction, the first and second electromagnets having the same number of coil turns, the first electromagnet being further from the specimen stage than the second electromagnet, the magnetic field generating means including a first direct current power supply electrically connected to the first electromagnet and a second direct current power supply electrically connected to the second electromagnet, and the first power supply supplying an amount of electrical current to the first electromagnet which is greater than an amount of electrical current supplied by the second power supply to the second electromagnet.

9. The microwave plasma generating device of claim 1, wherein the magnetic field generating means includes first and second electromagnets having coils concentric with each other and of identical gage wire, the first and second electromagnets being spaced apart in the axial direction with the first electromagnet being further from the specimen stage than the second electromagnet, the first and second electromagnets having the same number of coil turns, the magnetic field generating means including direct current power supply electrically connected to the first and second electromagnets, the power supply means supplying the first and second electromagnets with the same amount of electrical current, and the second electromagnet having a diameter which is greater than a diameter of the first electromagnet.

10. A method of forming a flat ECR layer in a microwave plasma generating device, the device including a plasma generating chamber into which gas is introduced for generating plasma therein, a microwave introducing system for supplying microwave energy into the plasma generating chamber, a specimen chamber communicated with the plasma generating chamber, a substrate holder in the specimen chamber for supporting a specimen to be treated by plasma generated in the plasma generating chamber, and at least first and second electromagnets, the first electromagnet being located further from the substrate holder than the second electromagnet, the first and second electromagnets being spaced apart in an axial direction, the first electromagnet having coils which are concentric with coils of the second electromagnet for generating a magnetic field in the plasma and specimen chambers, the method comprising the steps of:

introducing gas into the plasma generating chamber;

introducing microwave energy into the plasma generating chamber and generating plasma in the plasma generating chamber; and supplying a first amount of direct current to the first electromagnet and supplying a second amount of direct current to the second electromagnet so as to form constant strength magnetic field flux density lines lying in planes which are substantially parallel to each other and perpendicular to the axial direction and a flat ECR layer in the plasma wherein the ECR layer extends perpendicular to the axial direction over at least 50% of the width of the plasma chamber.

11. The method of claim 10, wherein the first and second electromagnets are supplied with different amounts of current.

12. The method of claim 10, wherein the first and second electromagnets are supplied with the same amounts of current.

13. The method of claim 10, wherein the first and second electromagnets have the same diameter, the first and second electromagnets have coils concentric with each other and of identical gage wire, the first electromagnet has a higher number of coil turns than the second electromagnet and the same amount of current is supplied to the first and second electromagnets.

14. The method of claim 10, wherein the first and second electromagnets have the same diameter, the first and second electromagnets have coils concentric with each other and of identical gage wire, the first electromagnets have the same number of coil turns, and the amount of electrical current supplied to the first electromagnet is greater than the amount of electrical current supplied to the second electromagnet.

15. The method of claim 10, wherein the first and second electromagnets have coils concentric with each other and of identical gage wire, the first and second electromagnets have the same number of coil turns, the second electromagnet has a diameter which is greater than a diameter of the first electromagnet, and the first and second electromagnets are supplied with the same amount of electrical current.

16. The method of claim 10, wherein the first and second electromagnets have the same diameter, the first and second electromagnets have coils concentric with each other and of identical gage wire, the first electromagnet has a higher number of coil turns than the second electromagnet and the amount of current supplied to the first electromagnet is less than the amount of current supplied to the second electromagnet.

17. The method of claim 10, wherein the first and second electromagnets have the same diameter, the first and second electromagnets have coils concentric with each other and of identical gage wire, the first electromagnet has a higher number of coil turns than the second electromagnet and the amount of current supplied to the first electromagnet is greater than the amount of current supplied to the second electromagnet.

18. The method of claim 10, wherein the first and second electromagnets have coils concentric with each other and of identical gage wire, the first and second electromagnets have the same number of coil turns, the second electromagnet has a diameter which is greater than a diameter of the first electromagnet, and the amount of current supplied to the first electromagnet is less than the amount of current supplied to the second electromagnet.

19. The method of claim 10, wherein the first and second electromagnets have coils concentric with each other and of identical gage wire, the first and second electromagnets have the same number of coil turns, and the second electromagnet has a diameter which is greater than a diameter of the first electromagnet, and the amount of current supplied to the first electromagnet is greater than the amount of current supplied to the second electromagnet.

20. The method of claim 10, wherein the flat ECR layer extends perpendicularly with respect to the axial direction and covers at least 75% of the width of the plasma generating chamber.

21. The method of claim 10, wherein the flat ECR layer extends perpendicularly with respect to the axial direction and covers at least 85% of the width of the plasma generating chamber.

* * * * *

UNITED STATES PATENT AND TRADEMARK OFFICE
CERTIFICATE OF CORRECTION

PATENT NO. : 5,198,725

DATED : March 30, 1993

INVENTOR(S) : Ching-Hwa Chen, et al.

It is certified that error appears in the above-identified patent and that said Letters Patent is hereby corrected as shown below:

Column 12, line 15, after "supply", insert --means-- therefor;

Column 13, line 2, after "first", insert --and second-- therefor.

Signed and Sealed this

Fourteenth Day of December, 1993

*Attest:*

BRUCE LEHMAN

*Attesting Officer*     *Commissioner of Patents and Trademarks*